US008466045B2

(12) United States Patent
Gumpher et al.

(10) Patent No.: US 8,466,045 B2
(45) Date of Patent: Jun. 18, 2013

(54) METHOD OF FORMING STRAINED EPITAXIAL CARBON-DOPED SILICON FILMS

(75) Inventors: John Gumpher, Niskayuna, NY (US); Seungho Oh, Austin, TX (US); Anthony Dip, Cedar Creek, TX (US)

(73) Assignee: Tokyo Electron Limited, Tokyo (JP)

( * ) Notice: Subject to any disclaimer, the term of this patent is extended or adjusted under 35 U.S.C. 154(b) by 363 days.

(21) Appl. No.: 12/830,210

(22) Filed: Jul. 2, 2010

(65) Prior Publication Data

US 2012/0003825 A1   Jan. 5, 2012

(51) Int. Cl.
*H01L 21/20* (2006.01)

(52) U.S. Cl.
USPC ........... 438/478; 438/282; 438/297; 438/481; 257/190; 257/586; 257/618; 257/E29.329

(58) Field of Classification Search
USPC .......... 257/190, 586, 618, 623, 625, E29.329; 438/282, 297, 343, 412, 481
See application file for complete search history.

(56) References Cited

U.S. PATENT DOCUMENTS

| | | | | |
|---|---|---|---|---|
| 7,906,817 | B1 * | 3/2011 | Wu et al. | 257/384 |
| 2005/0250302 | A1 * | 11/2005 | Todd et al. | 438/607 |
| 2007/0281411 | A1 | 12/2007 | Murthy et al. | |
| 2007/0287272 | A1 | 12/2007 | Bauer et al. | |
| 2008/0157091 | A1 * | 7/2008 | Shin et al. | 257/66 |
| 2008/0164491 | A1 * | 7/2008 | Liu et al. | 257/190 |
| 2009/0215249 | A1 | 8/2009 | Boland et al. | |

OTHER PUBLICATIONS

Ipri, A.C. et al. "Selective Epitaxial Growth for the Fabrication of CMOS Integrated Circuits", IEEE Transactions on Electron Devices, vol. ED-31, No. 12, Dec. 1984, pp. 1741-1748.

Yang, B. et al. "High-performance NMOSFET with in-situ Phosphorus-doped embedded Si:C (ISPD eSi:C) source-drain stressor", Electron Devices Meeting, IEDM 2008, IEEE International, Dec. 15-17, 2008, pp. 51-54.

* cited by examiner

*Primary Examiner* — Evan Pert
*Assistant Examiner* — Mark A Laurenzi

(57) ABSTRACT

A method for forming strained epitaxial carbon-doped silicon (Si) films, for example as raised source and drain regions for electronic devices. The method includes providing a structure having an epitaxial Si surface and a patterned film, non-selectively depositing a carbon-doped Si film onto the structure, the carbon-doped Si film containing an epitaxial carbon-doped Si film deposited onto the epitaxial Si surface and a non-epitaxial carbon-doped Si film deposited onto the patterned film, and non-selectively depositing a Si film on the carbon-doped Si film, the Si film containing an epitaxial Si film deposited onto the epitaxial carbon-doped Si film and a non-epitaxial Si film deposited onto the non-epitaxial carbon-doped Si film. The method further includes dry etching away the non-epitaxial Si film, the non-epitaxial carbon-doped Si film, and less than the entire epitaxial Si film to form a strained epitaxial carbon-doped Si film on the epitaxial Si surface.

20 Claims, 11 Drawing Sheets

METHOD OF FORMING STRAINED EPITAXIAL CARBON-DOPED SILICON FILMS

FIELD OF THE INVENTION

The present invention relates to the field of electronic manufacturing processes and devices, and more particularly, to methods of forming strained epitaxial carbon-doped silicon (Si) films on a substrate while forming electronic devices.

BACKGROUND OF THE INVENTION

Selective deposition of Si and Si-containing films has found many applications in semiconductor manufacturing. Recent applications include use as metal oxide semiconductor field effect transistor (MOSFET) channel stressors to enhance device mobility. Silicon germanium (SiGe) films are strong candidates for p-FET devices and carbon-doped silicon (SiC) films have been proposed for n-FET devices. Integrating embedded SiC (eSiC) films into state-of-the-art n-FET devices has been found to be extremely challenging and serious technology issues remain for SiC deposition processes, including how to deposit SiC films with reasonable cost of operating (CoO).

To achieve enhanced electron mobility in the channel of MOSFETs, it is desirable for the carbon-doped Si films to contain substitutional carbon atoms to induce tensile strain in the channel. Higher channel tensile strain can be achieved with increased substitutional carbon content in the carbon-doped Si source and drain. However, most of carbon atoms incorporated through selective SiC epitaxy process (for example at process temperature greater than 700° C.) occupy non-substitutional (i.e., interstitial) sites in the Si lattice. By lowering the growth temperature, a higher fraction of substitutional carbon level can be achieved (e.g., nearly 100% at growth temperature of 700° C.). However, the slow growth rate at these lower temperatures can be problematic for device applications, and selective deposition may not be possible at the lower temperatures. Blanket coverage of the substrate conventionally requires additional lithography and etching steps to remove the film from the unwanted areas of the substrate to form the desired pattern. These additional steps reduce throughput and increase the expense of forming patterned Si and Si-containing films.

Another approach to selectively form Si and Si-containing films involves non-selective film deposition and subsequent selective etching where areas with non-epitaxial films are substantially selectively removed due to higher etch rates than areas with epitaxial films. However, the epitaxial films are partially etched and may thus be damaged or degraded during the etching process.

SUMMARY OF THE INVENTION

Embodiments of the invention provide a method for forming strained epitaxial carbon-doped Si films on a patterned substrate. The strained epitaxial carbon-doped Si films can contain alternating epitaxial carbon-doped Si films and epitaxial undoped Si films. In one example, the tensile strained epitaxial carbon-doped Si films may be used as raised source and drain areas for electronic devices such as transistors. According to one embodiment, the strained epitaxial carbon-doped Si films have a carbon content greater than 1.5 atomic percent, for example about 2 atomic percent, and an activated carbon level greater than 85%, greater than 90%, or even greater than 95%.

According to one embodiment of the invention, a method is provided for processing a semiconductor structure. The method includes providing the structure in a processing space, the structure containing an epitaxial Si surface and a patterned film, non-selectively depositing a carbon-doped Si film onto the structure, the carbon-doped Si film including an epitaxial carbon-doped Si film deposited onto the epitaxial Si surface and a non-epitaxial carbon-doped Si film deposited onto the patterned film, and non-selectively depositing a Si film on the carbon-doped Si film, the Si film including an epitaxial Si film deposited onto the epitaxial carbon-doped Si film and a non-epitaxial Si film deposited onto the non-epitaxial carbon-doped Si film. The method further includes dry etching away the non-epitaxial Si film, the non-epitaxial carbon-doped Si film, and less than the entire epitaxial Si film to form a strained epitaxial carbon-doped Si film on the epitaxial Si surface, and optionally repeating the depositing and dry etching steps until the strained epitaxial carbon-doped Si film has a desired thickness.

DETAILED DESCRIPTION OF SEVERAL EMBODIMENTS OF THE INVENTION

Figure 1:
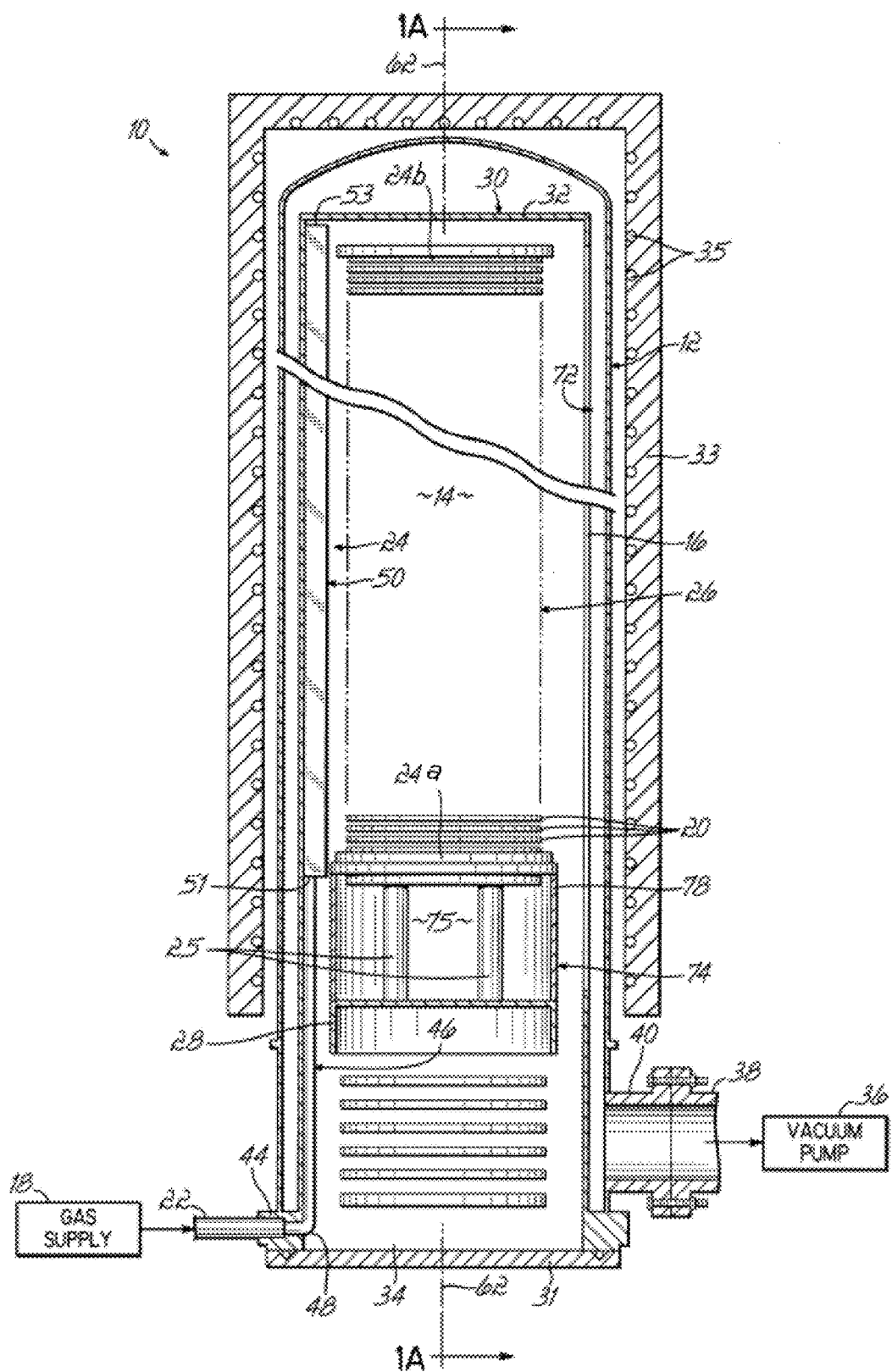
FIG. 1 is a cross-sectional front view of a thermal processing system according to an embodiment of the invention.

Embodiments of the invention provide methods for selectively forming strained epitaxial carbon-doped Si films on a patterned structure. As noted in the Background section above, selective deposition to form patterned Si and Si-containing films requires high substrate temperatures that are undesirable for thermal budgets of current and future processes. Moreover, the use of reduced temperatures during deposition result in loss of deposition selectivity, which can require additional lithography steps to create the desired pattern. Recognizing the limitations and problems of current deposition methods, the inventors have discovered a low temperature method for selectively forming strained epitaxial carbon-doped Si films on a semiconductor structure having an epitaxial Si surface and a patterned film. The method includes non-selectively depositing a carbon-doped Si film onto the structure, where the carbon-doped Si film includes an epitaxial carbon-doped Si film deposited onto the epitaxial Si surface and a non-epitaxial carbon-doped Si film deposited onto the patterned film. The method further includes non-selectively depositing a Si film on the carbon-doped Si film, where the Si film includes an epitaxial Si film deposited onto the epitaxial carbon-doped Si film and a non-epitaxial Si film deposited onto the non-epitaxial carbon-doped Si film, and dry etching away the non-epitaxial Si film, the non-epitaxial carbon-doped Si film, and less than the entire epitaxial Si film. Furthermore, the patterned film may subsequently be removed to form raised source and drain regions containing a strained epitaxial carbon-doped Si film.

The inventors have recognized that a dry etching process that provides higher etch rates for a non-epitaxial Si film compared to an epitaxial Si film, can be used to efficiently remove the non-epitaxial Si film from the substrate while the epitaxial Si film is etched at a lower rate and not completely removed. The etch time can be selected to remove the entire non-epitaxial Si film but less than the entire epitaxial Si film, thereby protecting the epitaxial carbon-doped Si film by the overlying epitaxial Si film during the etching process. Therefore, the epitaxial carbon-doped Si film is not exposed to the etching gases during the dry etching process and therefore not etched. The crystallographic structure of the non-epitaxial carbon-doped Si film and the non-epitaxial Si film can be polycrystalline or amorphous. For example, the etch rate for a polycrystalline Si (poly-Si) film is much greater than the etch rate for an epitaxial Si film when using an etching gas containing fluorine ($F_2$) or chlorine ($Cl_2$).

Epitaxial deposition is a process where the crystal lattice of a single crystal substrate is extended or at least substantially extended through deposition of a new epitaxial (single crystal) film that may have a different doping level than the single crystal substrate. The presence of dopants such as carbon creates film strain (stress) in the epitaxial doped film and the film may be integrated as a channel stressor in electronic devices to enhance electron or hole mobility and increase device speed.

In the following description, in order to facilitate a thorough understanding of the invention and for purposes of explanation and not limitation, specific details are set forth, such as a particular geometry of a thermal processing system and descriptions of various components. Further, examples are set forth regarding the deposition and use of strained carbon-doped Si films for electronic devices. However, it should be understood that the invention may be practiced in other embodiments that depart from these specific details.

FIG. 1 is a cross-sectional front view of a thermal processing system that may be utilized to form strained epitaxial carbon-doped Si films according to an embodiment of the invention. A process tool in the form of a thermal processing system 10 comprises an outer vessel or tube 12 and an inner tube or liner 30 disposed radially inside the outer tube 12. The liner 30 surrounds a process chamber or processing space 14 adapted to receive a batch of workpieces or substrates 20. The dimensions of the liner 30, and thus the size of the thermal processing system 10, may be scaled to accommodate substrates 20 of different sizes. The liner 30 may be composed of any high temperature material, such as quartz, silicon carbide, or other suitable ceramic material, and is removable for cleaning to remove accumulated deposits that are an artifact of substrate processing. Liner 30 is generally shaped like a right circular cylinder.

The thermal processing system 10 receives a metered stream or flow of a reactant, such as a process gas supplied from a gas supply 18. During a process run, the processing space 14 contains a partial pressure of the process gas, which is typically electronics grade in purity. The residence time of the process gas in the processing space 14 is sufficient to promote a chemical reaction, possibly with one or more additional process gases, to form a layer on the substrates 20 by deposition or growth, or to etch away a layer on the substrates 20. A delivery line 22 communicates a flow of the process gas from the gas supply 18 to a gas injector 24. The gas injector 24 has the form of a conduit stationed inside the processing space 14. The gas injector 24 injects the flow of process gas into the processing space 14 defined inside the liner 30. The injected process gas may comprise, for example, a chemical vapor deposition (CVD) precursor.

A carrier in the form of a boat 26, which may be composed of a high-temperature material such as quartz, is disposed inside the thermal processing system 10. The boat 26 is supported on a pedestal 28, which is lifted and lowered by a boat elevator (not shown) for exchanging substrates 20. The boat 26 includes a plurality of substrate holders defining vertically spaced slots for the substrates 20, which are supported about their peripheral edges. The substrate holders of the boat 26 are coupled in a vertically spaced relationship with a plurality of rods 25. The rods 25, which are mounted to the pedestal 28, extend between opposite end plates 24a,b and are arranged relative to each other to provide an access path to each of the slots. Adjacent substrates 20 are held by the boat 26 in a spaced relationship such that unreacted process gas readily passes through a gap, G (shown in FIG. 4), defined between each pair of adjacent substrates 20. Unprocessed substrates 20 are inserted into the holders of boat 26 and processed substrates 20 are removed from the substrate holders by an end effector coupled with a wafer-handling robot (not shown).

The liner 30, which peripherally bounds the processing space 14, has a closed end 32 and an open end 34 opposite to the closed end 32. The open end 34 has a sealing engagement with a base plate 31 to form the processing space 14, which completely encloses the substrates 20 during thermal processing. The boat 26 and the substrates 20 held by the boat 26 are disposed inside the liner 30 generally between the closed end 32 and the open end 34 of the liner 30.

A suitable heat source 33, which is positioned outside of the outer tube 12, includes heating elements 35 used to elevate the temperature of the outer tube 12 and liner 30 by heat transfer so that the processing space 14 is surrounded by a hot wall during substrate processing. The heat source 33 also operates to heat the substrates 20. The heat source 33 may be divided into a plurality of heating zones each having an independent power source for controlling the corresponding zone temperature. Temperature sensors (not shown), such as thermocouples or resistance temperature devices, are stationed along the height of the liner 30 and provide temperature information for the different heating zones. The temperature sensors supply feedback used by a temperature controller (not shown) to regulate the monitored temperature of the liner 30 in each of the heating zones. Typically, the zone temperatures of the heat source 33 are regulated to provide a flat or isothermal temperature profile for the liner 30 at a target temperature specified for the process, which is typically in the range of 200° C. to 1200° C. and, more typically, in the range of 250° C. to 800° C. The temperature controller may employ, for example, a proportional integral derivative (PID) algorithm based on feedback from the temperature sensors to determine the power applied to each zone of the heat source 33 based upon the error between the monitor and target temperatures.

Volatile reaction products and unreacted process gas from the process transpiring inside the processing space 14 are evacuated by a vacuum pump 36, which is coupled by a foreline 38 with a vacuum port 40 penetrating the outer tube 12 near the open end 34 of the liner 30. During operation, the evacuation of the processing space 14 is continuous, as is the injection of the process gas by the gas injector 24. Adjustment of the pumping speed of gases through foreline 38 and vacuum port 40 allows the pressure within the processing space 14 to be set.

A fluid feedthrough 44 is mounted to a port in the liner 30 near the open end 34 of the thermal processing system 10. The gas injector 24 is coupled with the delivery line 22 from the gas supply 18 by the fluid feedthrough 44. The delivery line 22, which is commonly made of a stainless steel, is transitioned in the fluid feedthrough 44 to communicate with the gas injector 24, which is commonly formed from a ceramic like quartz. In this manner, the process gas is transferred from the environment surrounding the thermal processing system 10 to the processing space 14 inside the liner 30.

Gas injector 24 has a tubular delivery section 46 that enters the liner 30 at a fluid entrance point via fluid feedthrough 44 and then bends at a near right angle 48 to extend vertically near the wall of the liner 30. The delivery section 46 joins or merges with a tubular injection section 50 of gas injector 24 that is positioned radially between the liner 30 and the boat 26. The intersection of the delivery section 46 with the injection section 50 defines an inlet 49 (FIG. 2) for process gas, which is communicated from the delivery section 46 to the injection section 50. The inlet 49 extends through at one end 51 of the injection section 50. The injection section 50 creates a rise that extends to a capped end 53 proximate to the closed end 32 of the liner 30. The radial proximity of the injection section 50 to the heated liner 30 rapidly heats the process gas flowing through the gas injector 24 significantly above the entry temperature into the thermal processing system 10.

Figures 2, 3, 4:
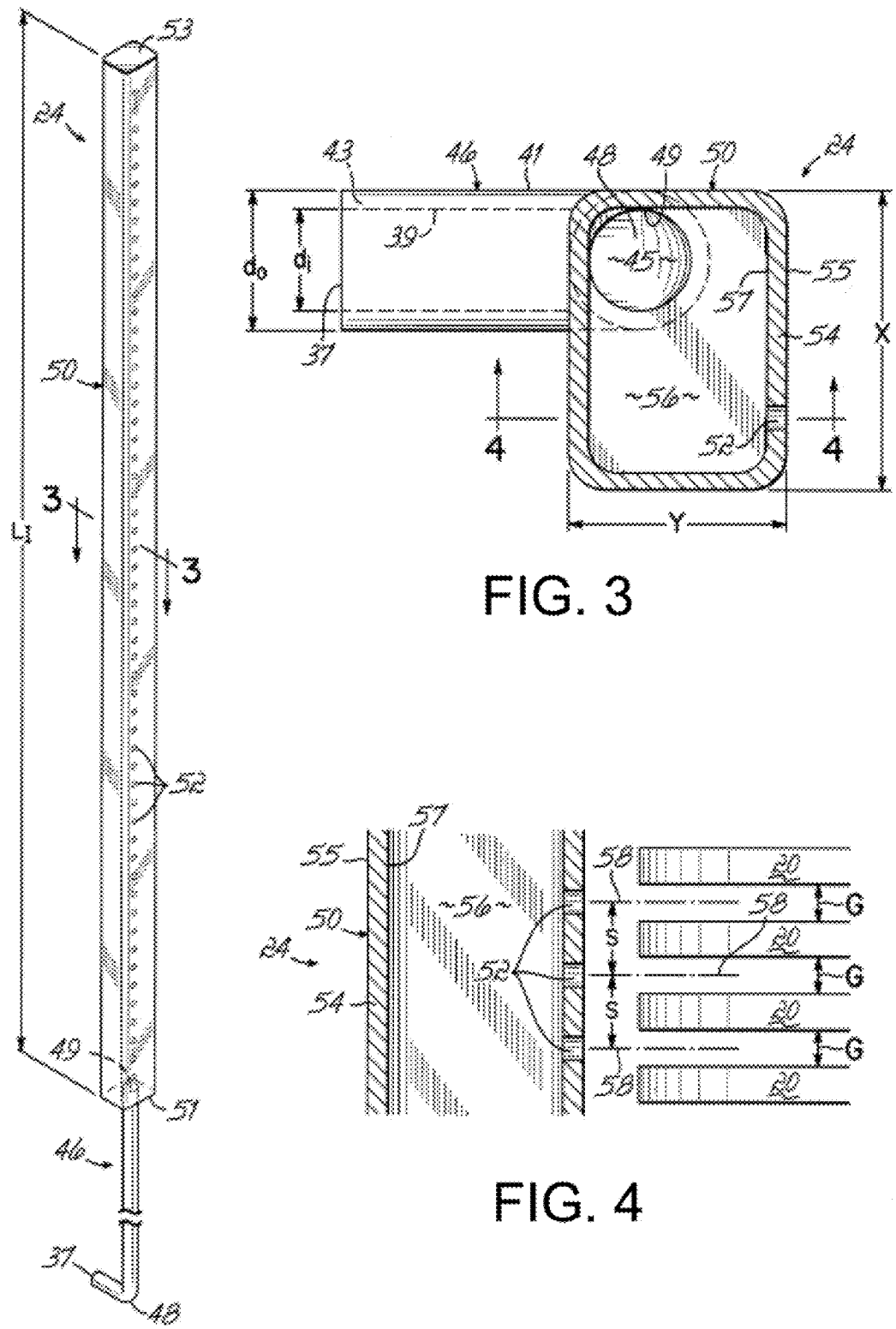
FIG. 2 is an isometric view of the gas injector of FIG. 1.
FIG. 3 is a cross-sectional view taken generally along line 3-3 of FIG. 2.
FIG. 4 is a cross-sectional view taken generally along line 4-4 of FIG. 3.

With reference to FIGS. 2-4 in which like reference numerals refer to like features in FIG. 1, the injection section 50 of the gas injector 24 is a tubular conduit having an outer surface 55 separated from an inner surface 57 by a sidewall 54 of a given thickness. The inner surface 57 of the injection section 50 bounds a fluid lumen 56 through which the process gas flows. The delivery section 46 is a tubular conduit that includes a fluid lumen 45 that intersects the inlet 49 to the fluid lumen 56 inside the injection section 50 at a location below the boat 26. As is apparent from FIG. 3, the fluid lumen 45 of delivery section 46 is offset from the centerline of the fluid lumen 56 at the inlet 49 so that the fluid lumens 45, 56 are not coaxial, although the invention is not so limited.

The tubular conduit comprising delivery section 46 has an inner surface 39 separated from an outer surface 41 by a sidewall 43. An open end 37 of the delivery section defines a gas entry point that is coupled with the gas supply 18 (FIG. 1). The fluid lumen 45 of the delivery section 46 may have a circular or round cross-sectional profile, when viewed axially, characterized by an inner diameter, $d_i$, and an outer diameter, $d_o$.

At least a portion of the fluid lumen 56 of the tubular conduit comprising the injection section 50 is characterized by a cross-sectional profile having a larger cross-sectional area than the cross-sectional area of the cross-sectional profile of fluid lumen 45. In the exemplary embodiment, the fluid lumen 56 has substantially rectangular cross-sectional profile, when viewed axially along the length, $L_I$, of the injection section 50, such that the cross-sectional profile of fluid lumen 56 is likewise substantially rectangular. The cross-sectional area of the fluid lumen 56 is equal to the product of its first and second minor dimensions, X and Y.

In alternative embodiments, the fluid lumen 56 may have a triangular, square, or even circular cross-sectional profile. Regardless of the cross-sectional profile, the cross-sectional area of at least a portion of the fluid lumen 56 in the injection section 50 is larger than the cross-sectional area of fluid lumen 45 in the delivery section 46. In one embodiment, the cross-sectional area of at least a portion of the fluid lumen 56 in the injection section 50 may be at least about three times greater than the cross-sectional area of fluid lumen 45 in the delivery section 46. In one embodiment, the increased cross-sectional area of fluid lumen 56, in comparison with fluid lumen 45, may extend along the entire length of the injection section 50, although the invention is not so limited.

Distributed along the injection section 50 of the gas injector 24 is a plurality of injection outlets 52. Each of the injection outlets 52 is symmetrical about a centrally aligned axis 58, which is oriented generally radially relative toward a central azimuthal axis 62 (FIG. 1). The outer tube 12 and liner 30 are generally symmetrical and coaxial about the azimuthal axis 62. Although the injection outlets 52 are shown as circular, the embodiments of the invention are not so limited as other open geometrical shapes may be used. The injection outlets 52 may have a uniform diameter that does not depend upon location along the length of the injection section 50.

The injection outlets 52 have a pitch or center-to-center distance, S, measured between the corresponding central axes 58 of adjacent outlets 52. In one embodiment, the pitch of the injection outlets 52 may be uniform along the length of the injection section 50. The pitch of the injection outlets 52 may be selected such that the axis 58 of each gas injection outlet 52 is aligned generally with the mid-point of the gap, G, between a nearest adjacent pair of substrates 20 held in the boat 26.

In an exemplary embodiment of the invention, the fluid lumen 56 has a first minor dimension, X, of about 16 mm and a second minor dimension, Y, of about 12 mm, and the sidewall 54 of the gas injector 24 has a wall thickness of about 1.3 mm. The fluid lumen 56 has a cross-sectional area of about 190 mm$^2$. The conduit forming delivery section 46 has an inner diameter, $d_i$, of about 7 mm and an outer diameter, $d_o$, of about 9.5 mm. The cross-sectional area of the fluid lumen 45 is about 45 mm$^2$. Gas outlets 52 are distributed along the length of the injection section 50 with a pitch of about 5.2 mm, which corresponds to the pitch, S, of the substrates 20 in the boat 26, and have a diameter of about 0.5 mm. The injection section 50 has a length of about 900 mm and the number of gas outlets 52 is 173. In another exemplary embodiment, the tubular conduit defining the fluid lumen 56 may be round with an inner diameter of about 12 mm and, thus, a cross-sectional area for the fluid lumen 56 of about 110 mm$^2$.

In different embodiments of the invention, the thermal processing system 10 may include additional gas injectors (not shown), each similar or identical to gas injector 24. These additional gas injectors may be fed process gas originating from gas supply 18 or from a different gas supply (not shown). In this manner, the thermal processing system 10 may be equipped with a plurality of two or more substantially identical gas injectors 24 each equipped with gas injection outlets 52.

Figure 1A:
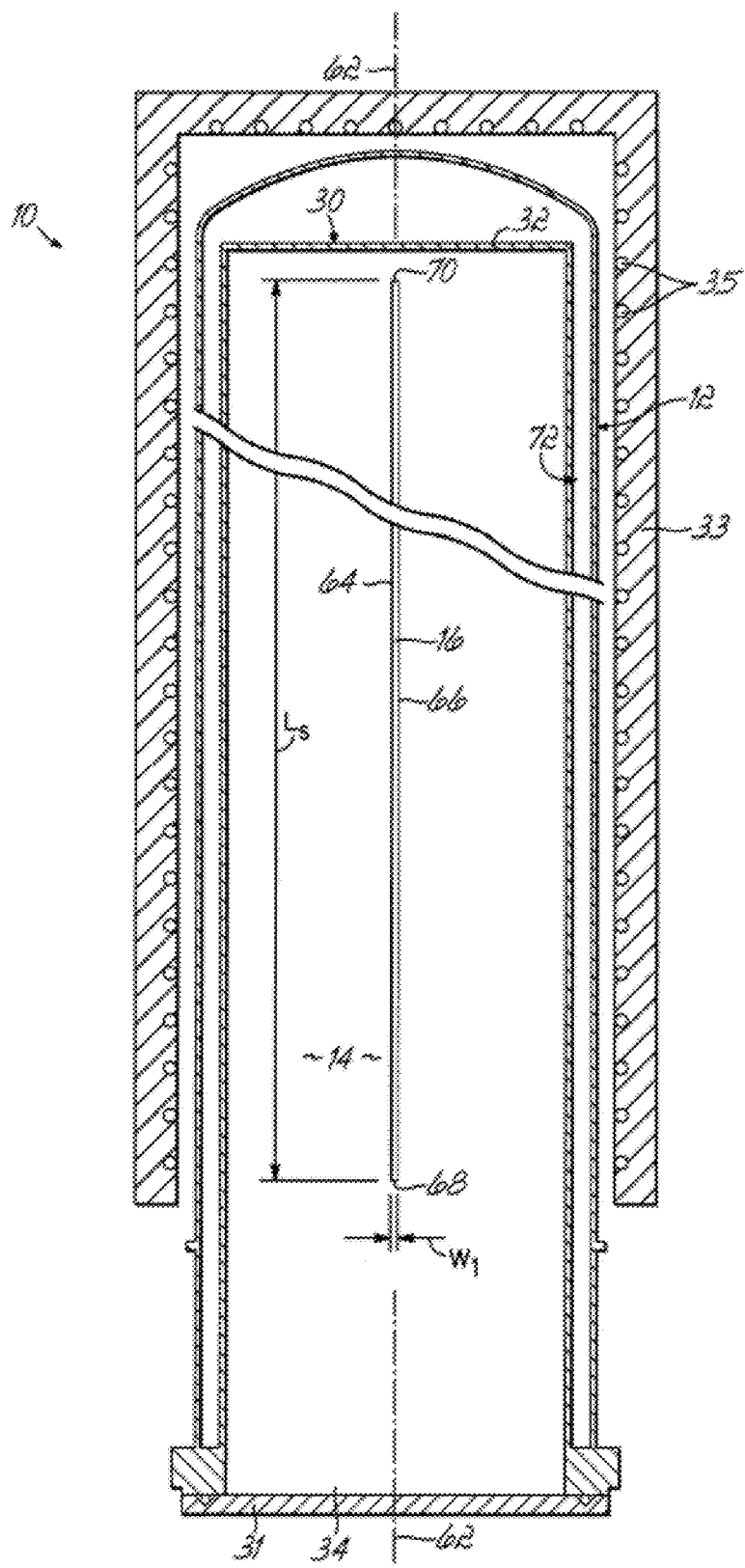
FIG. 1A is a cross-sectional view of the liner of FIG. 1.

With reference to FIGS. 1 and 1A, the liner 30 includes a narrow longitudinal slit 16 bounded by a pair of longitudinal edges 64, 66 generally aligned with the azimuthal axis 62 and a pair of circumferentially-extending transverse edges 68, 70 of substantially equal length that join the longitudinal edges 64, 66 to define closed ends. Slit 16 has a major dimension or length, $L_S$, substantially aligned with the azimuthal axis 62 and a circumferentially extending minor dimension or width, $W_1$. The width, $W_1$, is uniform along the major dimension of the slit 16. Slit 16 extends from a position slightly below the base of the boat 26 to a location adjacent to the top of the boat 26.

The slit 16 is located approximately diametrically opposite to the location of the injection section 50 of the gas injector 24. As a result, process gas cross-flow is promoted by the arrangement of the gas injection outlets 52, which inject the process gas, and the slit 16, which provides the outlet for unreacted process gas and volatile reaction products to an annular pumping space 72 disposed between the liner 30 and outer tube 12. The unreacted process gas and volatile reaction products are evacuated from the annular pumping space 72 (FIG. 1) by the vacuum pump 36 at the location of vacuum port 40. The width, $W_1$, of the slit 16 and separation of the longitudinal edges 64, 66 may be selected to provide a targeted cross-flow of process gas across the substrates 20 in the boat 26. In the embodiment shown in FIG. 1A, the slit 16 is unbroken and continuous along its length, $L_s$, and along its width, $W_1$, although the slit 16 may be segmented in alternative embodiments. In a specific embodiment, the width, $W_1$, of slit 16 may be about 5 millimeters (mm).

Slit 16 is believed to provide better gas dispersion for the process gas injected from the gas injector 24 by focusing the flow symmetrical about the opposite faces of the substrates 20. Although not wishing to be limited by theory, the slit 16 is believed to increase the gas velocities of the process gas injected from the gas injection outlets 52, in comparison with a conventional line of gas exhaust openings of progressively increasing diameter, because the slit 16 presents a larger resistance to gas flow than the gas exhaust openings found in conventional liners.

Figure 1B:
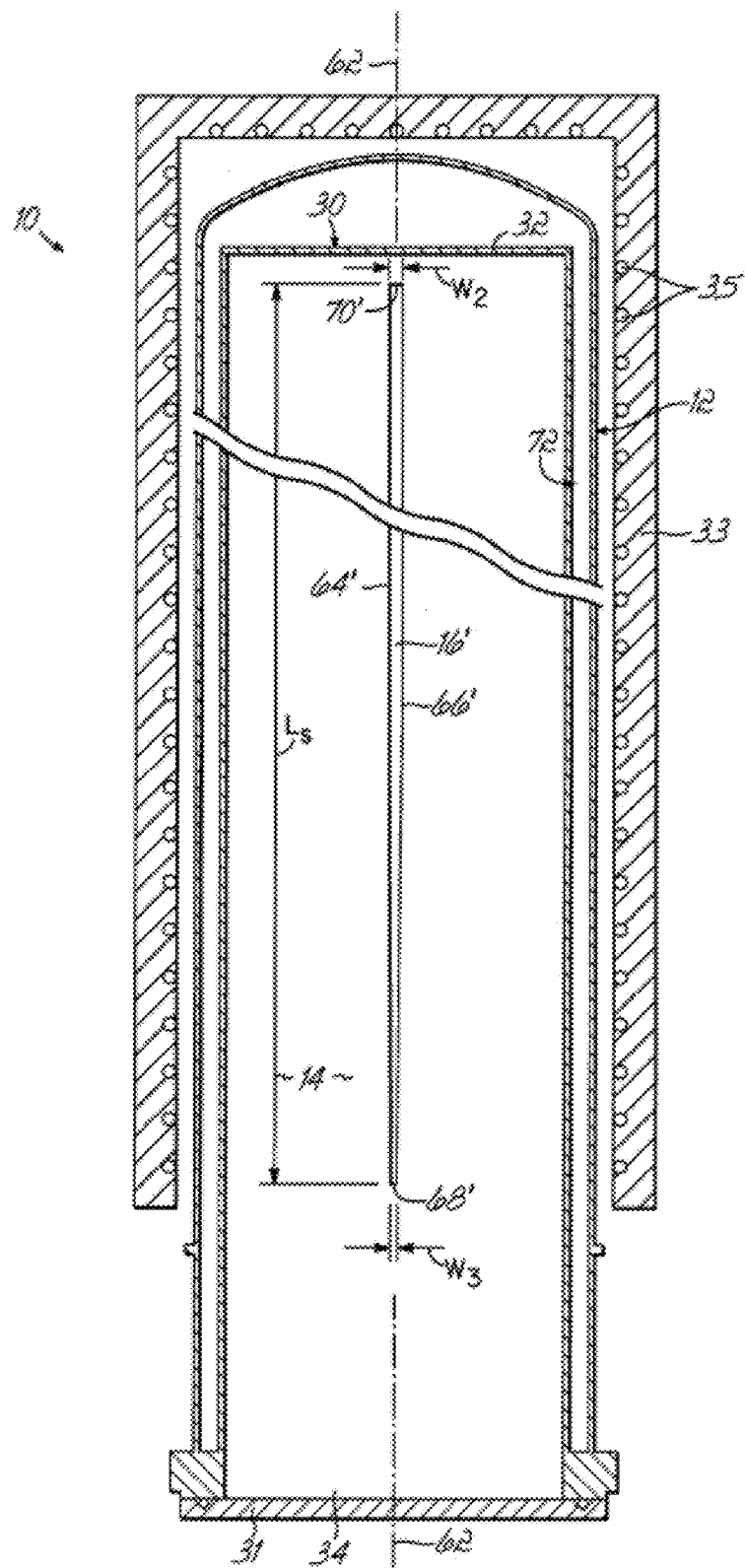
FIG. 1B is a cross-sectional view similar to FIG. 1A of a liner in accordance with an alternative embodiment of the invention.

With reference to FIG. 1B in which like reference numerals refer to like features in FIG. 1A and in an alternative embodiment, liner 30 may include a longitudinal slot or slit 16' bounded by a pair of longitudinal edges 64', 66' generally aligned with the azimuthal axis 62 and a pair of circumferentially-extending transverse edges 68', 70' that join the longitudinal edges 64', 66'. The width, $W_2$, of transverse edge 70' is greater than the width, $W_3$, of transverse edge 68'. At least a portion of the slit 16' is tapered to accommodate the tapering. In the exemplary embodiment of FIG. 1B, transverse edge 68' is shorter than transverse edge 70' and the slit 16' is tapered in a direction from edge 70' to edge 68' with the tapering initiated near the midpoint of the length, $L_s$, of the slit 16'. Conversely, the tapering of slit 16' may be reversed so that slit 16' is tapered in a direction from edge 68' to edge 70'. The tapering may extend along a portion of slit 16', as shown, or may extend along the entire length, $L_s$, of the slit 16'.

With renewed reference to FIG. 1, a pedestal cover or shroud 74 is disposed above the pedestal 28. The shroud 74 comprises a thin-walled, ring-shaped component with an annular sidewall 78 that extends about the pedestal 28. The sidewall 78 of the shroud 74 extends downwardly to contact the pedestal 28 so as to define a partition that at least partially encloses a substantially open space 75 located above the pedestal 28 and below the boat 26. Although not wishing to be limited by theory, at least partially closing the open space 75 with shroud 74 is believed to decrease the flow dispersion of unreacted process gas and volatile reaction products flowing through the annular pumping space 72 to the vacuum port 40 and to increase the average flow velocity between adjacent substrates 20. This improves the conductance for process gas flow past the open space 75 by reducing turbulence and, thereby, promoting laminar or molecular flow. In other words, the shroud 74 effectively blocks the high conductance path for process gas through the open space 75 to the slit.

In use and with reference to FIGS. 1, 1A, 2, 3, and 4, a process run is initiated with the liner 30 held at an idle temperature elevated significantly above room temperature. The substrates 20 are loaded into the boat 26 and the temperature of the liner 30 is ramped up to the target process temperature. Process gas is directed from the gas supply 18 at a controlled flow rate to the gas injector 24. Heat transferred from the liner 30 heats the process gas over the vertical rise of the gas injector 24 toward the closed end 32 of liner 30. The heated process gas is injected into the processing space 14 from the gas injection outlets 52 spaced along the length of the gas injector 24. The process gas and/or its reaction products may chemically react with the heated substrates 20 to form a surface layer on each substrate 20 or remove a layer from each of the substrates 20. Unreacted process gas and volatile reaction products are evacuated from the processing space 14 inside the liner 30 through the slit 16, into the annular pumping space 72, and ultimately to the vacuum port 40. The shroud 74 at least partially covers the open space 75 between the pedestal 28 and boat 26 so that the gas flow is more efficient between the base of the boat 26 and the vacuum port 40. After a given dwell time at the process temperature sufficient to accomplish the desired process, the process gas flow is discontinued, the liner 30 is cooled back to an idle temperature, and the processed substrates 20 are unloaded from the boat 26. Unprocessed substrates 20 are loaded into the boat 26 and another process run is initiated.

Further exemplary thermal processing systems are described in U.S. Pat. No. 7,632,354, titled "THERMAL PROCESSING SYSTEM WITH IMPROVED PROCESS GAS FLOW AND METHOD FOR INJECTING A PROCESS GAS INTO A THERMAL PROCESSING SYSTEM", the entire contents of which are hereby incorporated by reference.

It is to be understood that the thermal processing system 10 depicted in FIGS. 1-4 is shown for exemplary purposes only, as many variations of the specific hardware can be used to practice the present invention, and these variations will be readily apparent to one having ordinary skill in the art. The thermal processing system 10 can, for example, process substrates of any size, such as 200 mm substrates, 300 mm substrates, or even larger substrates. Furthermore, the thermal processing system 10 can simultaneously process up to about 200 substrates, or more. Alternately, the thermal processing system 10 can simultaneously process up to about 25 substrates. Although slow growth rates of films at lower temperatures can be problematic for device manufacturing, the large number of substrates that can be simultaneously processed in the thermal processing system 10 allows for high substrate throughput.

Figure 5A:
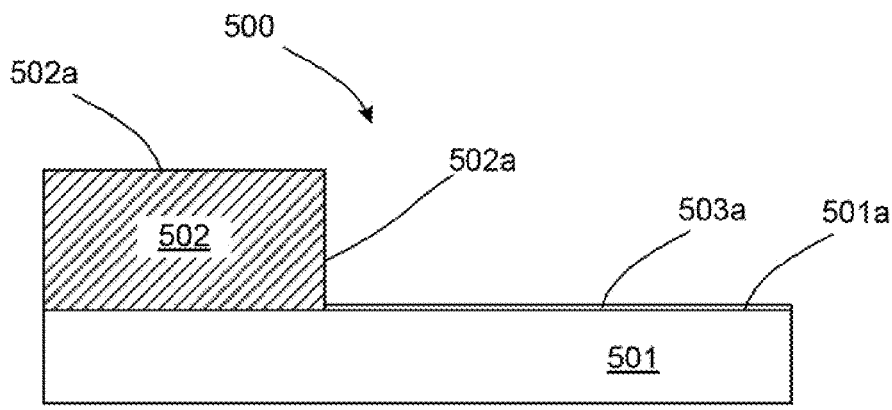
FIGS. 5A-5G schematically show formation of a strained epitaxial carbon-doped Si film on a substrate according to an embodiment of the invention.
Figure 5B:
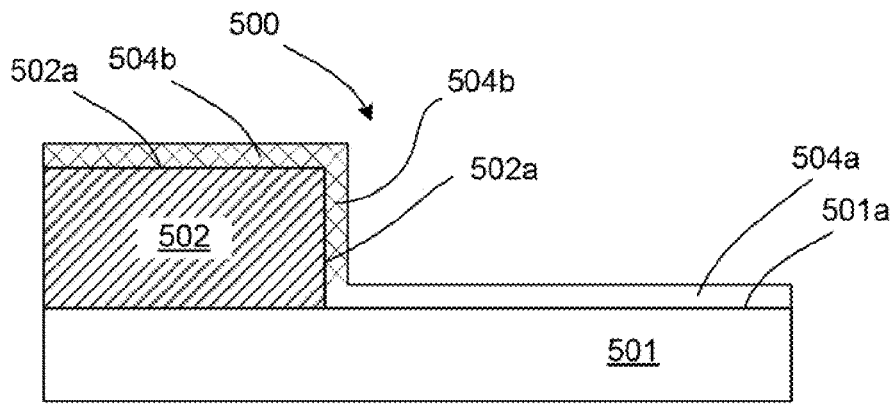
Figure 5C:
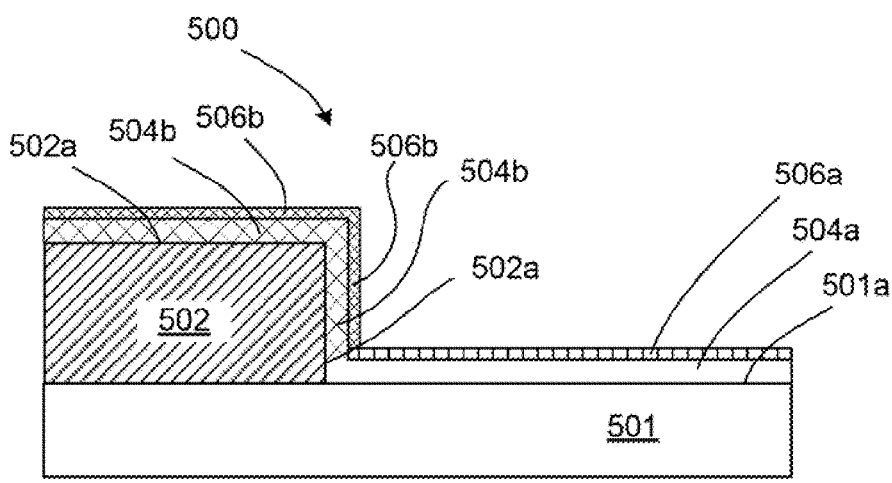
Figure 5D:
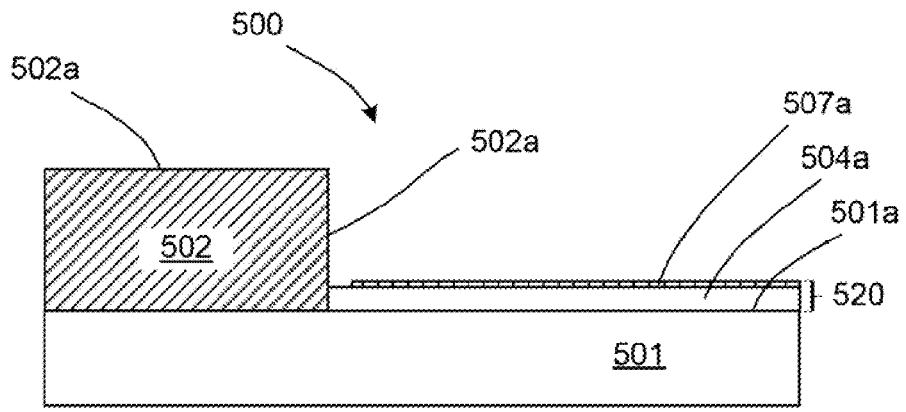
Figure 5E:
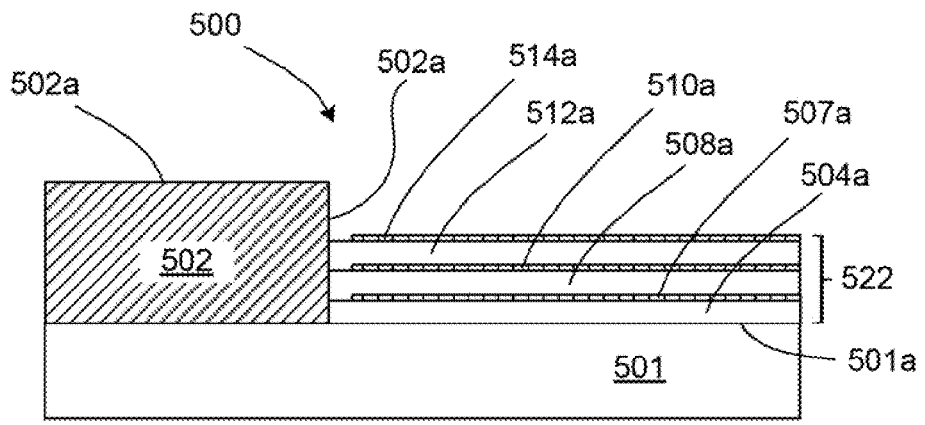
Figure 5F:
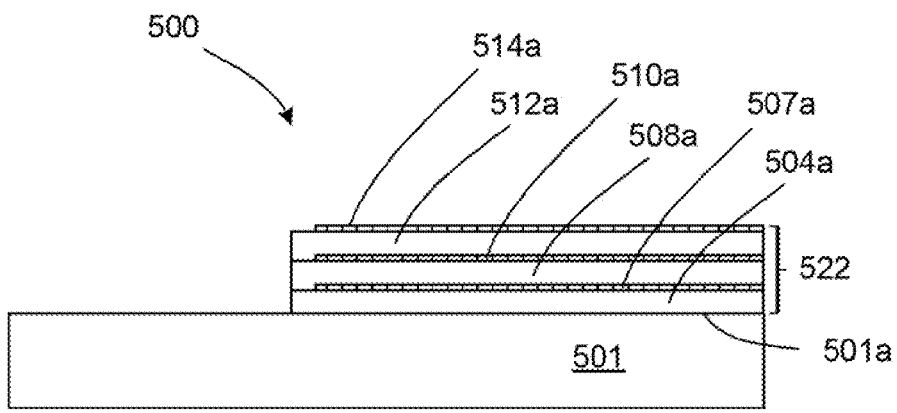
Figure 5G:
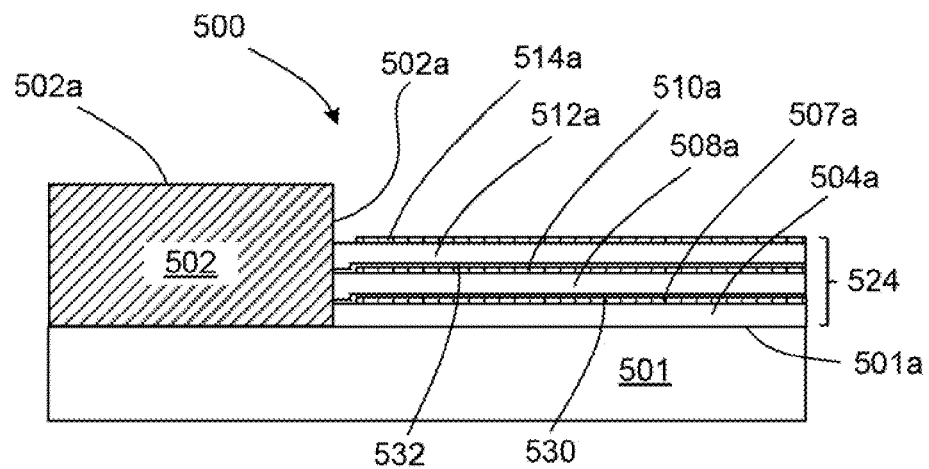
Figure 6:
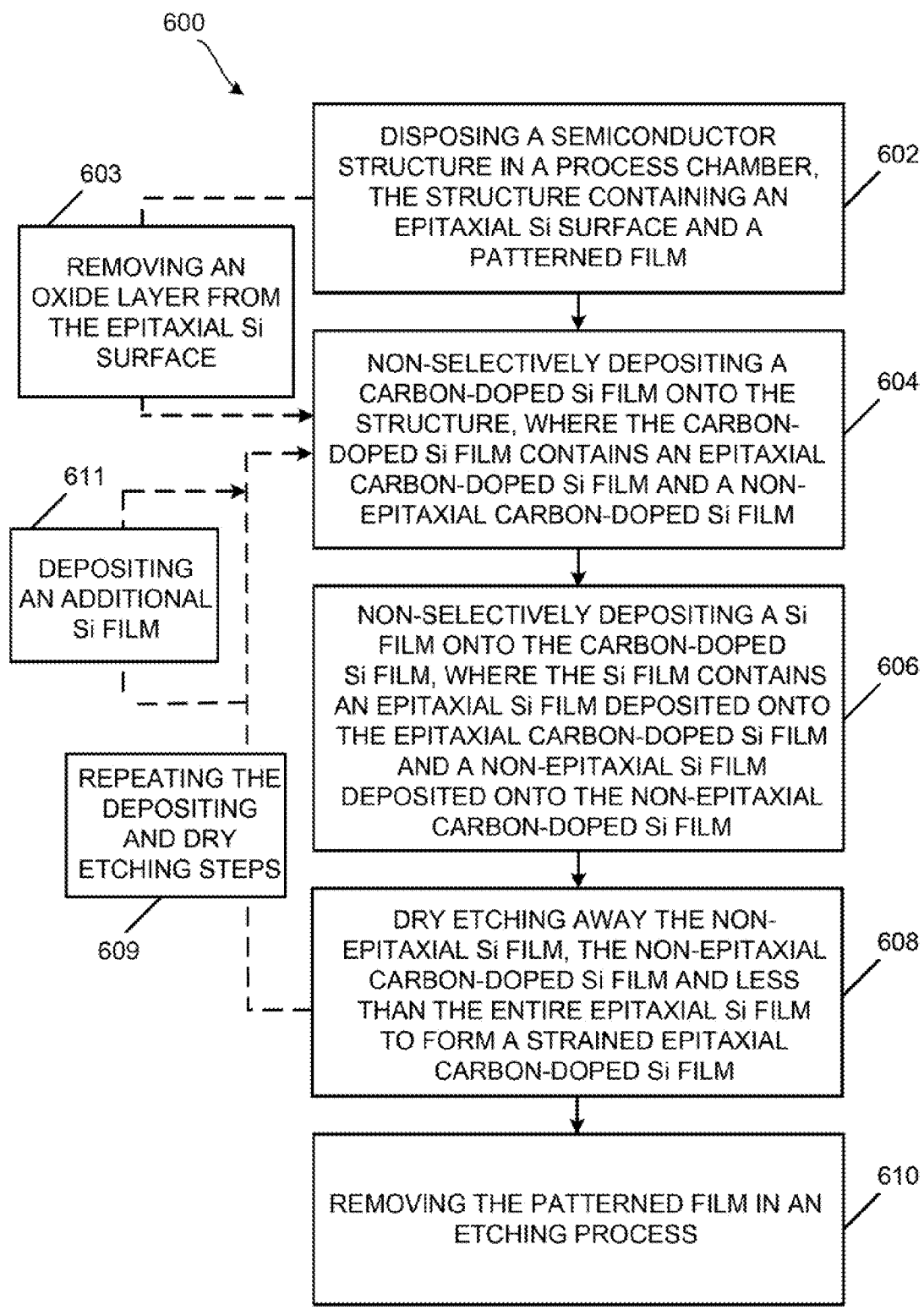
FIG. 6 is a flow diagram for forming a strained epitaxial carbon-doped Si on a substrate according to an embodiment of the invention.

Reference will now be made to FIG. 5 and FIG. 6. FIG. 6 is a flow diagram for forming a strained epitaxial carbon-doped Si film on a semiconductor structure and FIGS. 5A-5G schematically show formation of a strained epitaxial carbon-doped Si film on a semiconductor structure 500. In the process 600 of FIG. 6, in step 602, a semiconductor structure 500 containing a substrate 501, for example a single crystal Si substrate or an epitaxial Si substrate, and a patterned film 502 formed thereon, are disposed in a processing space. The processing space can, for example, be the processing space 14 of the thermal processing system 10 depicted in FIG. 1. As will be readily appreciated by those of ordinary skill in the art, the patterned film 502 may be any patterned film used in semiconductor manufacturing, for example a photolithographically formed film, a photoresist film, a hard mask, a dielectric film, a low-k film, or a high-k film, or a combination thereof. In one embodiment, the patterned film 502 can include a gate dielectric film of a gate structure, for example a transistor gate structure.

As shown in FIG. 5A, the substrate 501 may have an oxide layer 503a formed on the epitaxial Si surface 501a. The oxide layer 503a may be a native oxide layer that forms easily on the epitaxial Si surface 501a when the structure 500 is exposed to air, even at room temperature. In addition to inhibiting proper film seeding and epitaxial film growth, the presence of the oxide layer 503a can also reduce deposition selectivity on different substrate materials. The oxide layer 503a may be removed from the epitaxial Si surface 501a in optional step 603. Removal of the oxide layer 503a, and any other surface contamination, reveals a clean epitaxial Si surface 501a for depositing an epitaxial film on the exposed Si surface 501a, where the crystal lattice of the bulk substrate 501 is extended through growth of the epitaxial film. In one example, the oxide layer 503a may be removed by a $H_2$ anneal at a substrate temperature of 925° C. at a pressure of 4.5 Torr. Other exemplary methods and systems for removing an oxide layer from a substrate are described in U.S. Pat. No. 7,524,769, titled "A METHOD AND SYSTEM FOR REMOVING AN OXIDE FROM A SURFACE", and U.S. patent application Ser. No. 11/206,056, titled "LOW-TEMPERATURE OXIDE REMOVAL USING FLUORINE", the entire contents of both are hereby incorporated by reference. In another example, the oxide layer 503a may be removed from the epitaxial Si surface 501a by a chemical oxide removal (COR) process. Although not shown in FIG. 5A, surface 502a of the patterned film 502 may also contain an oxide layer or other surface contaminants that may be removed in the optional step 603.

Alternately, the optional step 603 may omitted from the process 600 if, for example, the epitaxial Si surface 501a is clean of any oxide or other surface contaminants when provided in the processing space.

In step 604, a carbon-doped Si film is non-selectively deposited (blanket deposition) onto the structure 500. The carbon-doped Si film contains an epitaxial carbon-doped Si film 504a deposited onto the epitaxial Si surface 501a and a non-epitaxial carbon-doped Si film 504b deposited onto the patterned film 502, as shown in FIG. 5B. The epitaxial Si surface 501a acts (after removal of the oxide layer 503a) as a seed layer for the epitaxial carbon-doped Si film 504a, resulting in the crystal lattice of the substrate 501 being extended through deposition of the epitaxial carbon-doped Si film 504a. Since the exposed surfaces 502a of the patterned film 502 do not possess the crystal lattice of epitaxial Si, the non-epitaxial carbon-doped Si film 504b containing poly-crystalline or amorphous carbon-doped Si is deposited on the exposed surfaces 502a of the patterned film 502. In one example, the substrate temperature can be varied to control whether poly-crystalline or amorphous carbon-doped Si film 504b is deposited onto the patterned film 502. For example, the non-epitaxial carbon-doped Si film 504b may change from an amorphous film to a poly-crystalline film in a substrate temperature range of about 480° C. to about 540° C. In one example, an amorphous carbon-doped Si film 504b may be deposited at a substrate temperature below about 530° C. whereas a polycrystalline carbon-doped Si film 504b may be deposited at a substrate temperature above about 530° C. The grain size of a polycrystalline carbon-doped Si film generally increases with increasing substrate temperature but the grain size may also depend on the silicon-containing deposition gas and the processing pressure. Furthermore, increasing the carbon-content of a carbon-doped Si film can lower the substrate temperature at which an amorphous film is deposited. A thickness of the epitaxial carbon-doped Si film 504a and the non-epitaxial carbon-doped Si film 504b can, for example, be between about 5 nm and about 100 nm. In another example, the thickness can be between about 20 nm and about 70 nm, but this is not required for embodiments of the invention as other thickness may be used.

The carbon-doped Si film in FIG. 5B may be deposited by exposing the structure 500 to a process gas containing a silicon-containing gas and a carbon-containing gas, a silicon- and carbon-containing gas, or combinations thereof. The silicon- and carbon-containing gas can include gases with Si—C bonds that preferentially form carbon-doped Si films with carbon in a substitutional position rather than in an interstitial position in the carbon-doped Si film lattice. Gases with Si—C bonds include alkyl silanes, for example $CH_3SiH_3$ (monomethyl silane, MMS), $(CH_3)_2SiH_2$ (dimethyl silane, DMS), $(CH_3)_3SiH$ (trimethyl silane, TMS), and $CH_3CH_2SiH_3$ (ethylsilane). The silicon-containing gas can include $SiH_4$, $SiCl_4$, $SiHCl_3$, $SiH_2Cl_2$, $SiH_3Cl$, or $Si_2Cl_6$, or a combination of two or more thereof. The carbon-containing gas can contain a hydrocarbon gas, for example $CH_4$ (methane), $CH_3CH_3$ (ethane), $CH_3CH_2CH_3$ (propane), ethylene ($CH_2CH_2$), ethyne ($C_2H_2$), propene ($C_3H_6$), butyne ($C_4H_6$), as well as others. The process gas can further contain an inert gas such as $N_2$ or a noble gas (e.g., Ar). The processing conditions can include a gas exposure time between 5 minutes and 60 minutes, for example 35 minutes, process gas pressures between 0.1 Torr and 10 Torr, or between 0.3 Torr and 1 Torr, and substrate temperatures between 450° C. and 650° C., or between 500° C. and 550° C. In one example, substrate temperatures between 450° C. and 550° C. may be used for MMS gas. Gas flow rates of the silicon- and carbon-containing gas, the silicon-containing gas, and the carbon-containing gas can be between 1 sccm and 1000 sccm, or between 4 sccm and 500 sccm.

In step 606, a Si film is non-selectively deposited onto the carbon-doped Si film. As shown in FIG. 5C, the Si film contains an epitaxial Si film 506a deposited onto the epitaxial carbon-doped Si film 504a and a non-epitaxial Si film 506b deposited onto the non-epitaxial carbon-doped Si film 504b. The epitaxial carbon-doped Si film 504a acts as a seed layer for the epitaxial Si film 506a, resulting in the crystal lattice of the epitaxial carbon-doped Si film 504a being extended through deposition of the epitaxial Si film 506a. Since the exposed surface of the non-epitaxial carbon-doped Si film 504b do not possess the crystal lattice of epitaxial Si, a non-epitaxial Si film 506b containing poly-crystalline or amorphous Si is deposited on the exposed surfaces of the non-epitaxial carbon-doped Si film 504b. The Si film may be deposited by exposing the structure 500 to a process gas containing a silicon-containing gas, for example $SiH_4$, $Si_2H_6$, $SiCl_4$, $SiHCl_3$, $SiH_2Cl_2$, $SiH_3Cl$, or $Si_2Cl_6$, or a combination of two or more thereof. A thickness of the epitaxial Si film 506a and the non-epitaxial Si film 506b can, for example, be between 1 nm and 10 nm, or between 3 nm and 5 nm. The processing conditions can include a gas exposure time between 1 minute and 30 minutes, for example 15 minutes, process gas pressures between 0.1 Torr and 10 Torr, or between 0.3 Torr and 1 Torr, and substrate temperatures between 450° C. and 650° C., or between 480° C. and 550° C. Gas flow rates of the silicon-containing gas can be between 1 sccm and 2000 sccm, or between 4 sccm and 500 sccm.

In step 608, a dry etching process is performed to etch away the non-epitaxial Si film 506b, the non-epitaxial carbon-doped Si film 504b, and less than the entire epitaxial Si film 506a to form a strained epitaxial carbon-doped Si film 520 containing the deposited epitaxial carbon-doped Si film 504a and the etched epitaxial Si film 507a. This is depicted in FIG. 5D. The higher etch rate of the non-epitaxial Si film 506b and the non-epitaxial carbon-doped Si film 504b relative to the epitaxial Si film 506a and the patterned film 502 allows for efficient removal of the films 506b and 504b while the epitaxial carbon-doped Si film 504a is not exposed to the etching gas and therefore not etched. Thus, the epitaxial Si film 506a provides an etch buffer and an etch stop layer to prevent or minimize potential damage to the epitaxial carbon-doped Si film 504a during the dry etching process. The dry etching process can be performed using an exposure to a process gas containing an etching gas containing $F_2$, $NF_3$, $ClF_3$, $Cl_2$, $H_2$, HF, HCl, or H, or a combination of two or more thereof. Embodiments of the invention are not limited to these etching gases, as other etching gases that provide sufficiently different etching rates for non-epitaxial Si films and non-epitaxial carbon-doped Si films relative to epitaxial Si films. The etching gas can further contain an inert gas such as $N_2$ or a noble gas (e.g., Ar). The inert gas can be used to control the concentration of the etchant species in the etching gas. The processing conditions can include a gas exposure time between 1 minute and 30 minutes, for example 4.5 minutes, etching gas pressures between 0.1 Torr and 10 Torr, or between 0.3 Torr and 1 Torr, and substrate temperatures between 450° C. and 650° C., or between 480° C. and 550° C. In one example, substrate temperatures between 450° C. and 550° C., for example 500° C., may be utilized for $Cl_2$ etching gas. Gas flow rates of the etching gas can be between 1 sccm and 500 sccm, or between 10 sccm and 200 sccm. Exemplary gas flow rates of the inert gas are between 100 sccm and 5000 sccm, for example 2000 sccm. Referring back to FIG. 1, the exemplary thermal processing system 10 is configured for providing a process gas cross-flow configuration which reduces etching gas depletion effects (e.g., chlorine depletion effect) commonly encountered in conventional non-cross-flow thermal processing systems.

The selective dry etching process is carried out for a time period that results in removal of the non-epitaxial Si film 506b, the non-epitaxial carbon-doped Si film 504b, and less than the entire epitaxial Si film 506a. The etching gas can be selected in view of desired etch rates of the non-epitaxial Si film 506b, the non-epitaxial carbon-doped Si film 504b, the epitaxial Si film 506a, and the patterned film 502. According to one embodiment of the invention, the etching gas may thermally react with the non-epitaxial Si film 506b, the non-epitaxial carbon-doped Si film 504b, and the epitaxial Si film 506a. Alternately, the process gas containing the etching gas may be excited by a plasma source (e.g., a remote plasma source) to enhance the removal rate of the films.

In step 609, the depositing and dry etching steps 604, 606, and 608 may be repeated any number of times until the strained epitaxial carbon-doped Si film has a desired thickness. FIG. 5E shows a strained epitaxial carbon-doped Si film 522 after performing each of the depositing and dry etching steps 604, 606, and 608 three times. The strained epitaxial carbon-doped Si film 522 contains etched epitaxial Si films 507a, 510a, and 514a, and epitaxial carbon-doped Si films 512a, 508a, and 504a. Thus, the etched epitaxial Si films 507a, 510a, and 514a are part of the strained epitaxial carbon-doped Si film 522. The chemical composition and profile of the sidewall of the strained epitaxial carbon-doped Si film 522 at the interface with the surface 502a of the patterned film 502 may be tailored by varying the thicknesses of the etched epitaxial Si films 514a, 510a, and 507a relative to the thicknesses of the epitaxial carbon-doped Si films 512a, 508a, and 504a.

In optional step 611, an additional Si film (not shown) may be non-selectively deposited onto the structure 500 in FIG. 5D, including on the etched epitaxial Si film 507a and on the surface 502a of the patterned film 502, prior to repeating step 604. A portion of the additional Si film is subsequently removed from the surface 502a of the patterned film 502 during the dry etching in step 608, thereby forming additional epitaxial Si film 530 on the etched epitaxial Si film 507a as depicted in FIG. 5G. FIG. 5G further shows additional epitaxial Si film 532 on the etched epitaxial Si film 510a. The additional Si film may be deposited by exposing the structure 500 to a process gas containing a silicon-containing gas, for example $SiH_4$, $Si_2H_6$, $SiCl_4$, $SiHCl_3$, $SiH_2Cl_2$, $SiH_3Cl$, or $Si_2Cl_6$, or a combination of two or more thereof. The processing conditions can include a gas exposure time between 1 minute and 30 minutes, for example 3 minutes with a Si deposition rate of 2-3 Å/min, process gas pressures between 0.1 Torr and 10 Torr, or between 0.3 Torr and 1 Torr, and substrate temperatures between 450° C. and 650° C., or between 480° C. and 550° C. Gas flow rates of the silicon-containing gas can be between 1 sccm and 1000 sccm, or between 4 sccm and 500 sccm. It was observed that the deposition of the additional epitaxial Si films 530 and 532 led to improved material properties of a strained epitaxial carbon-doped Si film 524. It is speculated that the improved material properties may be due to enhanced quality epitaxial growth of the epitaxial carbon doped films 508a and 510a on the additional epitaxial Si films 530 and 532.

In step 610, the patterned film 502 may be removed in an etching process. FIG. 5F shows the structure 500 following removal of the patterned film 502 in FIG. 5E. In other embodiments step 610 may be omitted and the patterned film 502 is a part of the electronic device. According to some embodiment of the invention, the strained epitaxial carbon-doped Si films 522 or 524 can form raised source/drain regions of a semiconductor device such as a transistor containing a gate stack between the raised source/drain regions.

Figure 7:
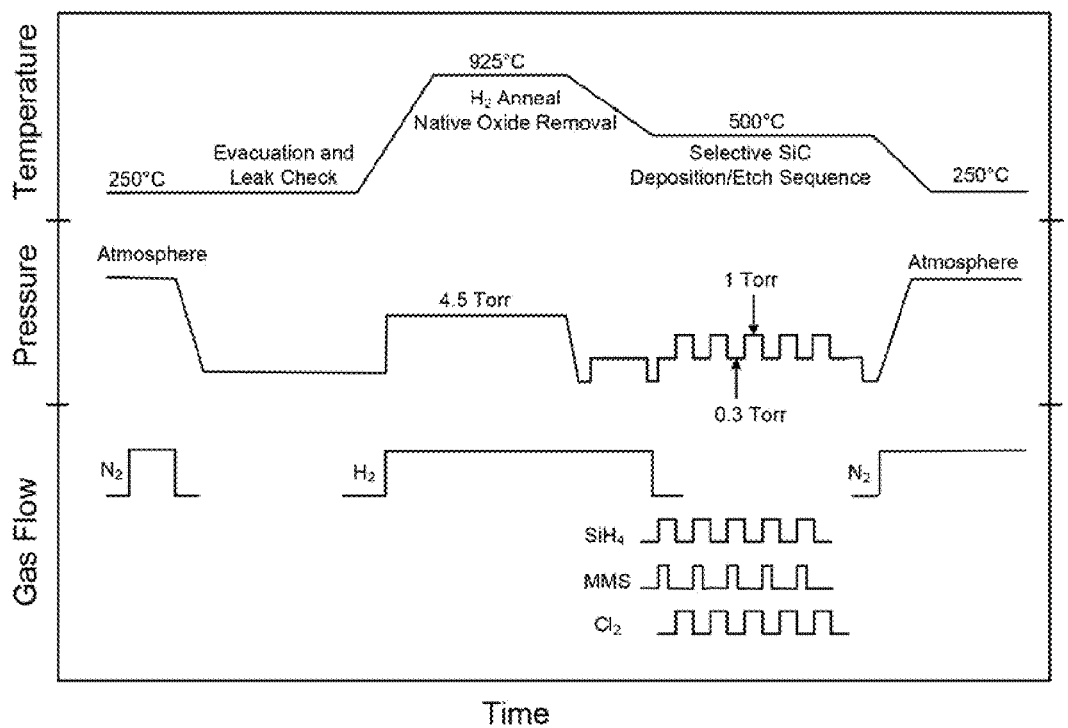
FIG. 7 schematically shows processing conditions during low pressure deposition of a strained epitaxial carbon-doped Si film according to an embodiment of the invention.

FIG. 7 schematically shows processing conditions during low pressure deposition of a strained epitaxial carbon-doped Si film according to an embodiment of the invention. The process flow includes loading the substrates into the thermal processing system 10 at atmospheric pressure and a temperature of 250° C. and purging the processing space 14 with $N_2$ gas. Following evacuation and leak checking, a native oxide layer is removed from the substrates. The native oxide layer is removed by flowing $H_2$ gas into the processing space 14, stabilizing the process pressure at 4.5 Torr, and ramping the substrate temperature up to 925° C. The substrates are maintained at 925° C. in the presence of the $H_2$ gas for 90 minutes. Thereafter, the substrate temperature is lowered to 500° C. for forming a strained epitaxial carbon-doped Si film on the substrates. As further shown in FIG. 7, the substrates are alternatively and sequentially exposed to a first process gas containing silane ($SiH_4$) and monomethyl silane (MMS), a second process gas containing $SiH_4$ but not MMS, and a third process gas containing $Cl_2$ etching gas. In the process flow depicted in FIG. 7, the alternating and sequential exposures of the first, second, and third process gases are each performed a total of five (5) times. Although not shown in FIG. 7, an additional Si film may be deposited after each (or less than frequently) etching step using 3 minute exposures of $SiH_4$ gas. A process pressure of 0.3 Torr can be maintained during the exposures of the first process gas and the second process gas, and a process pressure of 1 Torr can be maintained during the exposures of the third process gas. Thereafter, the substrate temperature is lowered to 250° C. as the processing space 14 purged with $N_2$ gas and the gas pressure increased to atmospheric pressure. Once at atmospheric pressure, the substrates are removed from the thermal processing system. The processing conditions further include exposure time of 35 minutes for each exposure of the first process gas containing a $SiH_4$ gas flow rate of 200 sccm and a MMS gas flow rate of 4.25 sccm, exposure time of 15 minutes for each exposure of the second process gas containing $SiH_4$, and an exposure time of 4.5 minutes for each exposure of the third process gas containing a gas $Cl_2$ gas flow rate of 95 sccm and a $N_2$ gas flow rate of 2000 sccm. As shown in FIG. 7, the depositing and dry etching steps are performed in the same process chamber and at the same substrate temperature (500° C.).

Figure 8A:
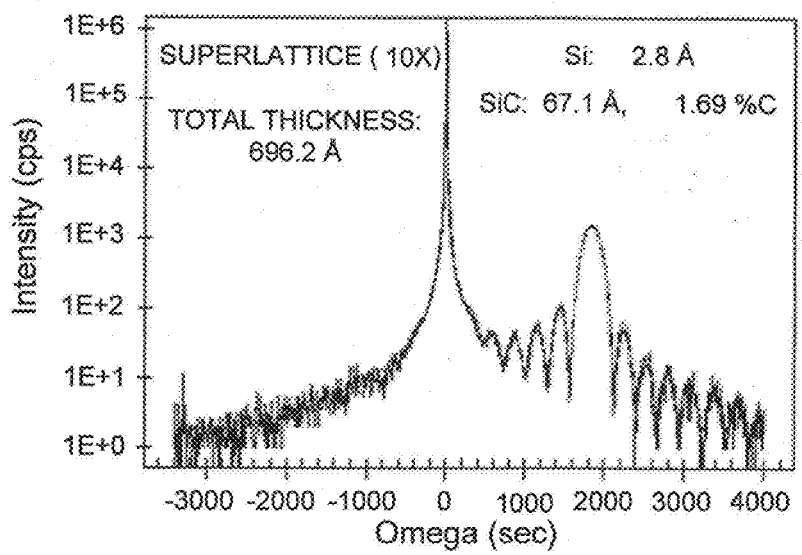
FIG. 8A shows a X-ray Diffraction (XRD) spectra of a strained epitaxial carbon-doped Si film deposited at low gas pressure according to one embodiment of the invention.

FIG. 8A shows X-ray Diffraction (XRD) spectra of strained epitaxial carbon-doped Si films deposited at low gas pressure according to one embodiment of the invention. The carbon-doped Si films were deposited using the process flow generally described above in FIG. 7 where that the alternating and sequential exposures of the first, second, and third process gases were each performed a total of 10 times and an additional Si film (not shown in FIG. 7) with a thickness of about 4-6 angstrom was deposited prior to repeating the exposures of the first process gas containing $SiH_4$ and MMS. The XRD analysis shows a strained epitaxial carbon-doped Si film with atomic carbon-content of 1.69% and a total thickness of 696.2 angstrom, where each deposition/etch cycle yielded an average epitaxial carbon-doped Si film thickness of about 67.1 angstrom and an etched Si film thickness of about 2.8 angstrom. The XRD analysis utilized changes in film lattice spacing to calculate atomic carbon-content, where the atomic carbon-content measures the amount of activated carbon in the epitaxial carbon-doped Si film, and where the activated carbon refers to substitutional carbon in the crystal lattice of epitaxial carbon-doped Si film.

Figure 8B:
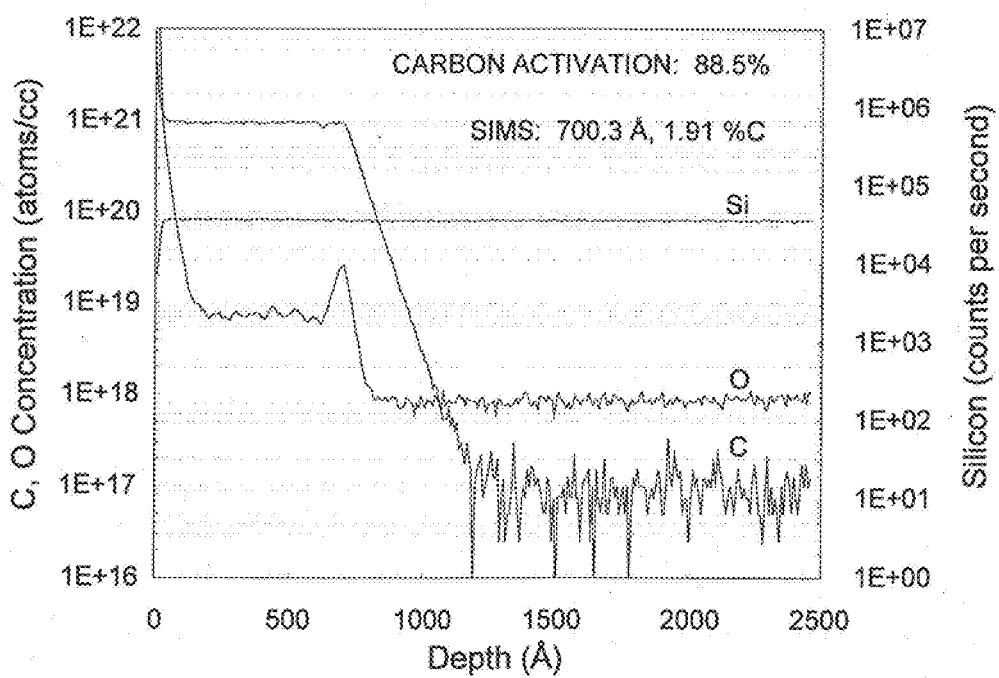
FIG. 8B shows a secondary ion mass spectroscopy (SIMS) spectra of a strained epitaxial carbon-doped Si film deposited at low gas pressure according to one embodiment of the invention.

FIG. 8B shows secondary ion mass spectroscopy (SIMS) spectra of the strained epitaxial carbon-doped Si films of FIG. 8A. SIMS analysis shows a strained epitaxial carbon-doped Si film with atomic carbon-content of 1.91% and a thickness of 700.3 angstrom. The atomic carbon-content obtained by the SIMS analysis measures the total amount of carbon in the strained epitaxial carbon-doped Si film, including both substitutional and interstitial carbon. The ratio of the atomic carbon-content results from the XRD and SIMS analysis reveals a carbon activation of 88.5% (percent of total carbon-content that is substitutional carbon).

Figure 9:
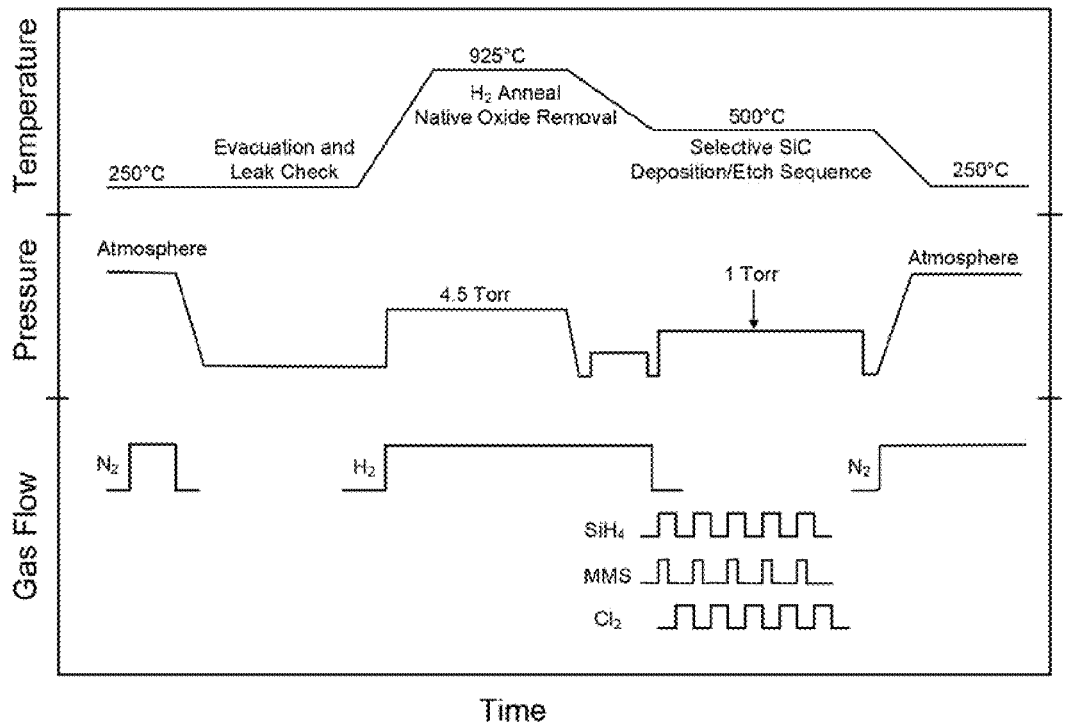
FIG. 9 schematically shows processing conditions during high gas pressure deposition of a strained epitaxial carbon-doped Si film according to an embodiment of the invention.

FIG. 9 schematically shows processing conditions during high pressure deposition of strained epitaxial carbon-doped Si films according to an embodiment of the invention. The processing conditions shown in FIG. 9 are similar to those shown in the low pressure deposition process flow in FIG. 7 but the alternating and sequential exposures of the first, second, and third process gases were each performed a total of 10 times and an additional Si film with a thickness of about 4-6 angstrom was deposited prior to repeating the exposures to $SiH_4$ and MMS. Further, a process pressure of 1 Torr was maintained during the exposure to the first, second, and third process gas. The processing conditions further included exposure time of 20 minutes for each exposure of the first process gas containing $SiH_4$ gas flow rate of 200 sccm and MMS gas flow rate of 4.9 sccm, exposure time of 7 minutes for each exposure of the second process gas containing $SiH_4$, and an exposure time of 4.5 minutes for each exposure of the third process gas containing a gas $Cl_2$ gas flow rate of 95 sccm and a $N_2$ gas flow rate of 2000 sccm. As shown in FIG. 9, the depositing and dry etching steps are performed in the same process chamber and at the same substrate temperature (500° C.).

Figure 10A:
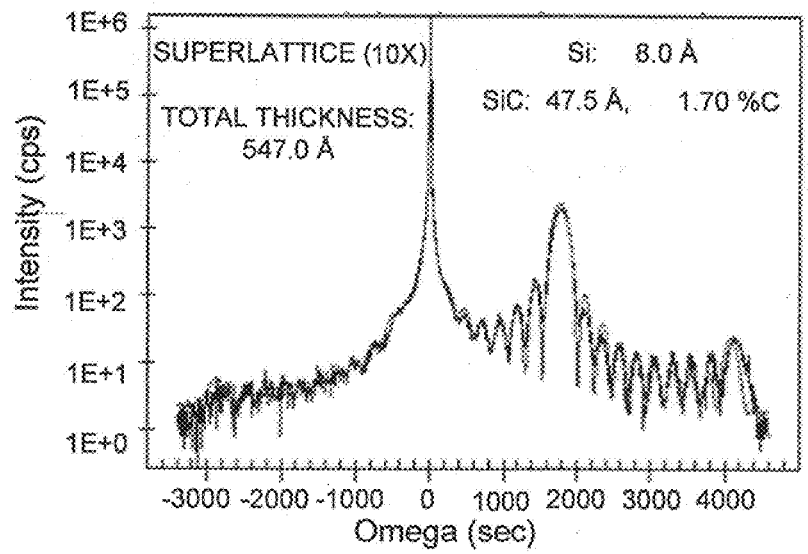
FIG. 10A shows a XRD spectra of a strained epitaxial carbon-doped Si film deposited at high gas pressure according to one embodiment of the invention.
Figure 10B:
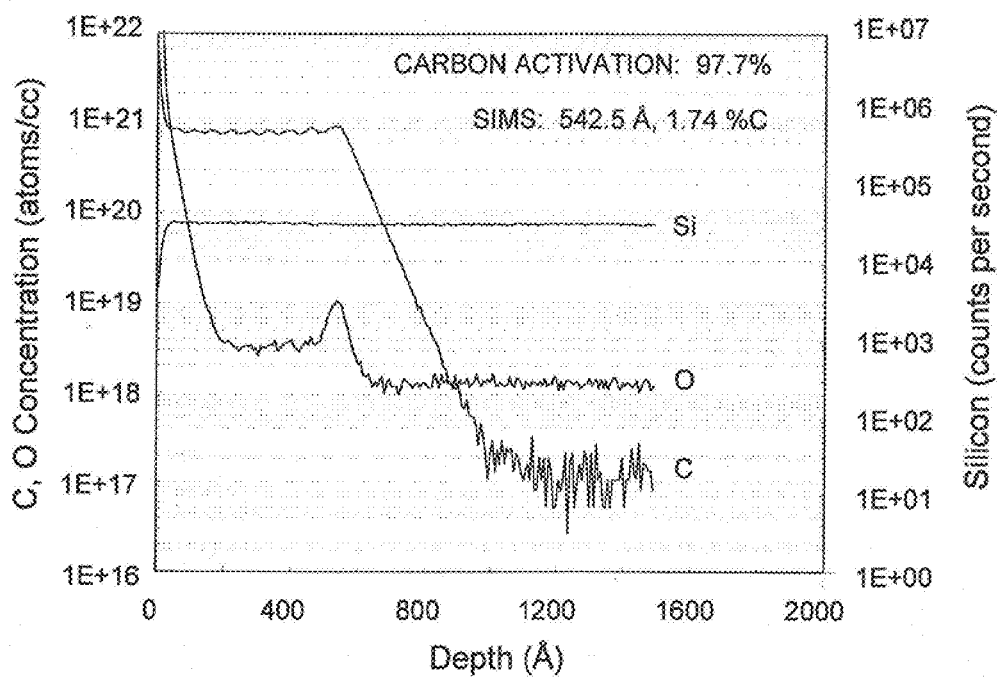
FIG. 10B shows a SIMS spectra of a strained epitaxial carbon-doped Si film deposited at high gas pressure according to one embodiment of the invention.

FIG. 10A shows XRD spectra of strained epitaxial carbon-doped Si films deposited at high gas pressure as generally described above in FIG. 9 where that the alternating and sequential exposures of the first, second, and third process gases were each performed a total of 10 times, and an additional Si film (not shown in FIG. 9) with a thickness of about 4-6 angstrom was deposited prior to repeating the exposures of the first process gas containing $SiH_4$ and MMS. XRD analysis shows a strained epitaxial carbon-doped Si film with atomic carbon-content of 1.70% and a total thickness of 547.0 angstrom, where each deposition/etch cycle yielded an average epitaxial carbon-doped Si film thickness of about 47.5 angstrom and an etched Si film thickness of about 8.0 angstrom. FIG. 10B shows SIMS spectra of the strained epitaxial carbon-doped Si films of FIG. 10A. SIMS analysis shows a strained epitaxial carbon-doped Si film with atomic carbon-content of 1.74% and a thickness of 542.5 angstrom. Analysis of the XRD and SIMS spectra revealed a carbon activation of 97.7%.

Strained epitaxial carbon-doped Si films deposited at substrate temperatures above 500° C. had lower carbon activation levels than the films shown in FIGS. 8 and 10. For example, films deposited at 600° C. had carbon activation of about 50% and films deposited at 650° C. had carbon activation of 10-20%.

Figure 11:
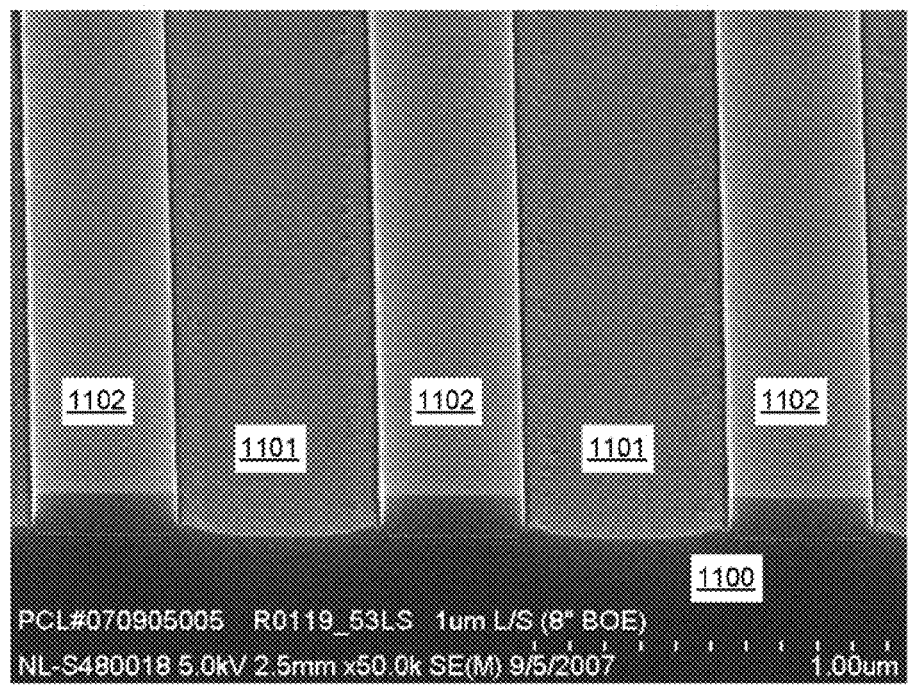
FIG. 11 shows a scanning electron microscope (SEM) graph of a strained epitaxial carbon-doped Si film selectively formed on a semiconductor structure.

FIG. 11 shows a tilted cross-sectional scanning electron microscope (SEM) graph of a strained epitaxial carbon-doped Si film 1101 that was selectively formed at high gas pressure on a single crystal Si substrate 1100 between patterned films 1102.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of processing a semiconductor structure, comprising:

providing the structure in a processing space, the structure comprising an epitaxial Si surface and a patterned film;

non-selectively depositing a carbon-doped Si film onto the structure, the carbon-doped Si film comprising an epitaxial carbon-doped Si film deposited onto the epitaxial Si surface and a non-epitaxial carbon-doped Si film deposited onto the patterned film;

non-selectively depositing a Si film on the carbon-doped Si film, the Si film comprising an epitaxial Si film deposited onto the epitaxial carbon-doped Si film and a non-epitaxial Si film deposited onto the non-epitaxial carbon-doped Si film;

performing dry etching that removes the non-epitaxial Si film, the non-epitaxial carbon-doped Si film, and less than the entire epitaxial Si film to form a strained epitaxial carbon-doped Si film on the epitaxial Si surface, wherein the epitaxial carbon-doped Si film is not directly exposed to an etching gas during the dry etching, and wherein the strained epitaxial carbon-doped Si film contains the dry etched epitaxial Si film and the unetched epitaxial carbon-doped Si film; and repeating the non-selectively depositing steps and the dry etching step until the strained epitaxial carbon-doped Si film has a desired thickness.

2. The method of claim 1, further comprising removing a native oxide layer from the structure to reveal the epitaxial Si surface.

3. The method of claim 2, wherein the removing comprises exposing the substrate to a cleaning gas comprising $F_2$, $NF_3$, $ClF_3$, $Cl_2$, $H_2$, HF, HCl, or H, or a combination of two or more thereof.

4. The method of claim 1, wherein the patterned film comprises a photoresist film, a hard mask, a dielectric film, a low-k film, or a high-k film, or a combination of two or more thereof.

5. The method of claim 1, wherein the non-selectively depositing a carbon-doped Si film comprises exposing the substrate to a silicon- and carbon-containing gas, or a silicon-containing gas and a carbon-containing gas.

6. The method of claim 5, wherein the silicon- and carbon-containing gas comprises an alkyl silane.

7. The method of claim 5, wherein the silicon- and carbon-containing gas comprises monomethyl silane, dimethyl silane, trimethyl silane, ethylsilane, or a combination of two or more thereof.

8. The method of claim 5, wherein the silicon-containing gas comprises $SiCl_4$, $SiHCl_3$, $SiH_2Cl_2$, $SiH_3Cl$, $SiH_4$, $Si_2H_6$, or $Si_2Cl_6$, or a combination of two or more thereof.

9. The method of claim 5, wherein the carbon-containing gas comprises a hydrocarbon gas.

10. The method of claim 1, wherein the dry etching comprises exposing the Si film to an etching gas comprising $F_2$, $NF_3$, $ClF_3$, $Cl_2$, $H_2$, HF, HCl, or H, or a combination of two or more thereof.

11. The method of claim 1, wherein the non-selectively depositing steps and the dry etching process step are performed in the processing space at the same substrate temperature.

12. The method of claim 1, further comprising
prior to the optionally repeating, depositing an additional Si film on the strained epitaxial carbon-doped Si film and on the patterned film, and wherein the dry etching further comprises dry etching the additional Si film from the patterned film.

13. The method of claim 1, further comprising
following the repeating, removing the patterned film from the structure in an etching process.

14. A method of forming raised carbon-doped Si source and drain regions on a substrate, comprising:
providing a patterned structure in a processing space, the patterned structure comprising an epitaxial Si surface and a patterned film;
non-selectively depositing a carbon-doped Si film onto the patterned structure, the carbon-doped Si film comprising an epitaxial carbon-doped Si film deposited onto the epitaxial Si surface and a non-epitaxial carbon-doped Si film deposited onto an exposed surface of the patterned film;
non-selectively depositing a Si film on the carbon-doped Si film, the Si film comprising an epitaxial Si film deposited onto the epitaxial carbon-doped Si film and a non-epitaxial Si film deposited onto the non-epitaxial carbon-doped Si film;

performing dry etching that removes the non-epitaxial Si film, the non-epitaxial carbon-doped Si film, and less than the entire epitaxial Si film to form a strained epitaxial carbon-doped Si film on the epitaxial Si surface, wherein the epitaxial carbon-doped Si film is not directly exposed to an etching gas during the dry etching, and wherein the strained epitaxial carbon-doped Si film contains the dry etched epitaxial Si film and the unetched epitaxial carbon-doped Si film; and repeating the depositing non-selectively depositing steps and the dry etching step until the strained epitaxial carbon-doped Si film has a desired thickness and forms raised carbon-doped Si source and drain regions on the epitaxial Si surface, wherein the strained epitaxial carbon-doped Si film has a carbon content of greater than 1.5 atomic percent and an activated carbon level greater than 85 percent, and wherein the depositing and dry etching steps are performed in the processing space at the same substrate temperature.

15. The method of claim 14, wherein the non-selectively depositing a carbon-doped Si film comprises exposing the substrate to a process gas containing an alkyl silane.

16. The method of claim 14, wherein the dry etching comprises exposing the Si film to an etching gas comprising $F_2$, $NF_3$, $ClF_3$, $Cl_2$, $H_2$, HF, HCl, or H, or a combination of two or more thereof.

17. The method of claim 14, further comprising
prior to the repeating, depositing an additional Si film on the strained epitaxial carbon-doped Si film and on the patterned film, and wherein the dry etching further comprises dry etching the additional Si film from the patterned film.

18. A method of forming raised carbon-doped Si source and drain regions on a substrate, comprising:
providing a patterned structure in a processing space, the patterned structure comprising an epitaxial Si surface and a patterned film;
non-selectively depositing a carbon-doped Si film onto the structure using an alkyl silane gas, the carbon-doped Si film comprising an epitaxial carbon-doped Si film deposited onto the epitaxial Si surface and a non-epitaxial carbon-doped Si film deposited onto the patterned film;
non-selectively depositing a Si film on the carbon-doped Si film, the Si film comprising an epitaxial Si film deposited onto the epitaxial carbon-doped Si film and a non-epitaxial Si film deposited onto the non-epitaxial carbon-doped Si film;
dry etching using $Cl_2$ etching gas the non-epitaxial Si film, the non-epitaxial carbon-doped Si film, and less than the entire epitaxial Si film to form a strained epitaxial carbon-doped Si film on the epitaxial Si surface, wherein the epitaxial carbon-doped Si film is not directly exposed to an etching gas during the dry etching process, and wherein the strained epitaxial carbon-doped Si film contains the dry etched epitaxial Si film and the unetched epitaxial carbon-doped Si film; and
repeating the non-selectively depositing steps and the dry etching step until the strained epitaxial carbon-doped Si film comprises raised source and drain regions, wherein depositing and dry etching steps are performed in the same process chamber and at the same substrate temperature.

19. The method of claim 18, wherein the strained epitaxial carbon-doped Si film has a carbon content greater than 1.5 atomic percent and an activated carbon level greater than 85 percent.

20. The method of claim 18, further comprising
prior to the repeating, depositing an additional Si film on the strained epitaxial carbon-doped Si film and on the patterned film, and wherein the dry etching further comprises dry etching the additional Si film from the patterned film.

* * * * *

UNITED STATES PATENT AND TRADEMARK OFFICE
CERTIFICATE OF CORRECTION

| | |
|---|---|
| PATENT NO. | : 8,466,045 B2 |
| APPLICATION NO. | : 12/830210 |
| DATED | : June 18, 2013 |
| INVENTOR(S) | : John Gumpher et al. |

It is certified that error appears in the above-identified patent and that said Letters Patent is hereby corrected as shown below:

In the Claims

In Claim 12, Column 15, Line 44: after "prior to the", delete "optionally".

Signed and Sealed this
Eleventh Day of March, 2014

Michelle K. Lee
*Deputy Director of the United States Patent and Trademark Office*